(12) United States Patent
Han et al.

(10) Patent No.: US 8,828,867 B2
(45) Date of Patent: Sep. 9, 2014

(54) SYSTEM AND METHOD FOR MANUFACTURING CONTACT

(75) Inventors: Tao Han, Shanghai (CN); Jianguo Fan, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 246 days.

(21) Appl. No.: 11/950,370

(22) Filed: Dec. 4, 2007

(65) Prior Publication Data
US 2008/0138981 A1 Jun. 12, 2008

(30) Foreign Application Priority Data

Dec. 5, 2006 (CN) .......................... 2006 1 0119379

(51) Int. Cl.
*H01L 21/768* (2006.01)
*H01L 21/316* (2006.01)

(52) U.S. Cl.
CPC .................................. *H01L 21/316* (2013.01)
USPC .................................. 438/675; 257/E21.585

(58) Field of Classification Search
CPC ............ H01L 21/316; H01L 21/76801; H01L 21/76802; H01L 27/10861; H01L 29/66181; H01L 21/28079
USPC ........................... 438/627, 643, 653, 674–688
See application file for complete search history.

(56) References Cited

U.S. PATENT DOCUMENTS

| | | | | |
|---|---|---|---|---|
| 6,074,954 A | * | 6/2000 | Lill et al. ....................... | 438/710 |
| 6,664,161 B2 | * | 12/2003 | Chudzik et al. ............... | 438/243 |
| 2002/0055225 A1 | * | 5/2002 | Gonzalez et al. ............. | 438/253 |
| 2004/0169255 A1 | * | 9/2004 | Kiyotoshi ...................... | 257/532 |
| 2005/0006769 A1 | * | 1/2005 | Givens et al. .................. | 257/751 |
| 2005/0260411 A1 | * | 11/2005 | Ravi .............................. | 428/408 |
| 2006/0102977 A1 | * | 5/2006 | Fucsko et al. ................. | 257/499 |
| 2006/0264043 A1 | * | 11/2006 | Stewart et al. ................ | 438/678 |

* cited by examiner

*Primary Examiner* — David Vu
*Assistant Examiner* — Jonathan Han
(74) *Attorney, Agent, or Firm* — Kilpatrick Townsend & Stockton LLP (57) ABSTRACT

System and method for manufacturing contact. According to an embodiment, the present invention provides a method for manufacturing integrated circuits. The method includes a step for providing a semiconductor substrate. The method also includes a step for defining a plurality of contact regions on the semiconductor substrate. The method further includes a step for forming a plurality of dielectric structures on the plurality of contact regions. Additionally, the method includes a step for forming a plurality of openings on the semiconductor substrate. For example, each of the openings is characterized by at least a depth, a width, and an aspect ratio. Furthermore, the method includes a step for performing deposition within the openings using a first type of material, which includes a titanium material. The method additionally includes a step for performing annealing at a predetermined set of conditions.

20 Claims, 9 Drawing Sheets

SYSTEM AND METHOD FOR MANUFACTURING CONTACT

CROSS-REFERENCES TO RELATED APPLICATIONS

This application claims priority to Chinese Patent No. 200610119379.3, filed Dec. 5, 2006, commonly assigned and hereby incorporated by reference for all purposes.

BACKGROUND OF THE INVENTION

The present invention is directed to integrated circuits and their processing for the manufacture of semiconductor devices. More particularly, the invention provides a method and system for forming contacts on integrated circuits. Merely by way of example, the invention has been applied to the annealing processes for the manufacture of integrated circuits. But it would be recognized that the invention has a much broader range of applicability.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed. An example of such a limit is chemical dry etching process used for the manufacture of integrated circuits in a cost effective and efficient way.

The manufacturing of integrated circuits involves various processes. For example, the processes include, inter alia, wafer growth, photolithography, doping, oxidation, deposition, etching removal, contact deposition, and epitaxial growth.

One of the various processes is forming a electrical contacts for certain types of integrated circuits, such as DRAM cells. According to a conventional technique, electrical contacts are formed by coupling tungsten material and dielectric materials. Usually, it is desirable for the contact to be structurally stable and low-resistance. Various conventional techniques have been developed toward these goals. Unfortunately, conventional techniques are often inadequate.

Therefore, improved system and method for forming contacts for integrated circuit devices are desired.

BRIEF SUMMARY OF THE INVENTION

The present invention is directed to integrated circuits and their processing for the manufacture of semiconductor devices. More particularly, the invention provides a method and system for forming contacts on integrated circuits. Merely by way of example, the invention has been applied to the annealing processes for the manufacture of integrated circuits. But it would be recognized that the invention has a much broader range of applicability.

According to an embodiment, the present invention provides a method for manufacturing integrated circuits. The method includes a step for providing a semiconductor substrate. The method also includes a step for defining a plurality of contact regions on the semiconductor substrate. The method further includes a step for forming a plurality of dielectric structures on the plurality of contact regions. Additionally, the method includes a step for forming a plurality of openings on the semiconductor substrate. For example, each of the openings is characterized by at least a depth, a width, and an aspect ratio. Furthermore, the method includes a step for performing deposition within the openings using a first type of material, which includes a titanium material. The method additionally includes a step for performing annealing at a predetermined set of conditions, which includes a predetermined range of temperatures and a predetermined range of oxygen concentrations. For example, the predetermined range of oxygen concentrations is approximately between 141 parts per million to 1,000 parts per million. Also, the method includes a step for forming metals contacts by filling a tungsten material into the plurality of openings. For example, the metal contacts is associated with a low resistance value.

According to another embodiment, the present invention provides a method for manufacturing integrated circuits. The method includes a step for providing a semiconductor substrate. The method also includes a step for defining a plurality of contact regions on the semiconductor substrate. Additionally, the method includes a step for forming a plurality of dielectric structures on the plurality of contact regions. The method further includes a step for forming a plurality of openings on the semiconductor substrate. Each of the openings is characterized by at least a depth, a width, and an aspect ratio. Also, the method includes a step for performing deposition within the openings using a first type of material (e.g. a titanium material). The method further includes a step for forming a thickness of oxidation layer on the first type of material. Moreover, the method includes a step for forming metals contacts by filling a tungsten material into the plurality of openings. Among other things, the metal contacts is associated with a low resistance value.

According to yet another embodiment, the present invention provides a method for manufacturing integrated circuits. The method includes a step for providing a partially processed semiconductor substrate. The partially processed semiconductor substrate includes at least one opening positioned within a dielectric structure. The method also includes a step for forming a deposition layer within the at least one opening using a first type of material, which includes a titanium material. The method additionally includes a step for performing annealing at a predetermined set of conditions, which includes a predetermined range of temperatures and a predetermined range of oxygen concentrations. For example, the predetermined range of oxygen concentrations is approximately between 141 parts per million to 1,000 parts per million. Furthermore, the method includes a step for forming metals contacts by filling a tungsten material into the plurality of openings. For example, the metal contacts are associated with a low resistance value.

Many benefits are achieved by way of the present invention over conventional techniques. For example, the present technique provides an easy to use process that relies upon conventional technology. In some embodiments, the present invention provides an improved method for forming contacts with high performance and low resistance. Additionally, the method provides a process that is compatible with conventional process technology without substantial modifications to conventional equipment and processes. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

The present invention is directed to integrated circuits and their processing for the manufacture of semiconductor devices. More particularly, the invention provides a method and system for forming contacts on integrated circuits. Merely by way of example, the invention has been applied to the annealing processes for the manufacture of integrated circuits. But it would be recognized that the invention has a much broader range of applicability.

As discussed above, forming electrical contacts on semiconductor substrates is often an important aspect for the manufacturing of integrated circuits. Usually, various structures of in semiconductor substrates need electrical contacts in order to electrically couple to other devices and perform their intended functions. For better performance and reliability, it is often desirable for electrical contacts to have low resistance value and strong bond to substrates. As integrated circuits become small, meeting these goals is becoming increasingly difficult.

Over the past, conventional techniques have been developed for forming electrical contacts. For example, "tungsten plug" structure has been implemented for many applications. Unfortunately, with integrated circuits becoming increasingly smaller, tungsten plug type of structure has become difficult to implement. Among other things, it has been difficult to manufacture contacts using tungsten plug structure with high performance and low resistance.

Figure 1:
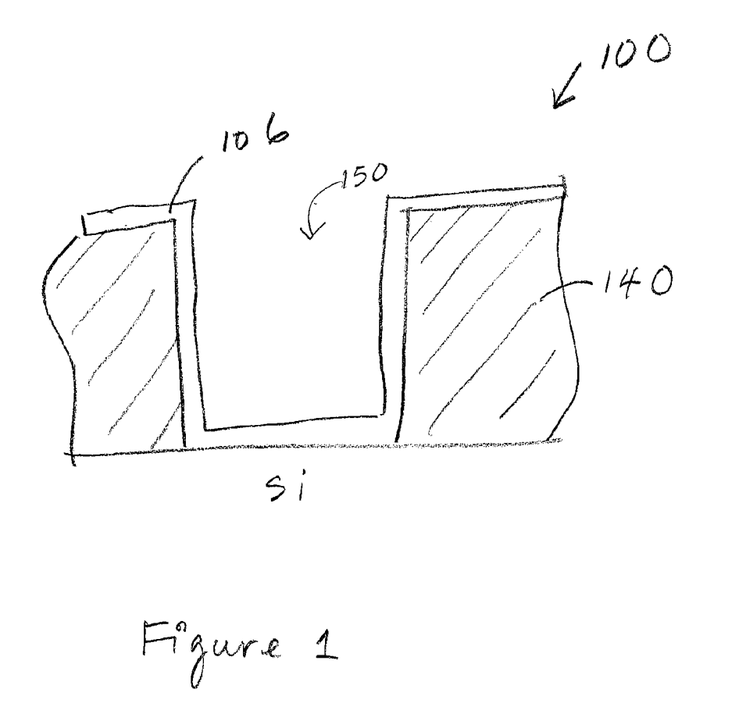
FIG. 1 is a simplified diagram of a conventional dielectric structure for forming metal contacts.

FIG. 1 is a simplified diagram of a conventional dielectric structure for forming metal contacts. This diagram is merely an example, which should not unduly limit the scope of the claims. One of ordinary skill in the art would recognize many variations, alternatives, and modifications.

As shown in FIG. 1, a metal contact structure 100 includes dielectric structures and/or layer 140, which provide an opening 150 for forming contacts. A metal deposition layer 106 is provided to cover the opening 150. For example, the metal deposition layer 106 includes titanium and/or titanium nitride material. Usually, the layer 106 is formed by depositing titanium and/or titanium nitride material over the opening and performing annealing at approximately 550 degrees Celsius. Once the layer 106 is deposited and annealed, conductive material (e.g., metal material) can be filled into the opening 150 to form a contact.

Figure 2:
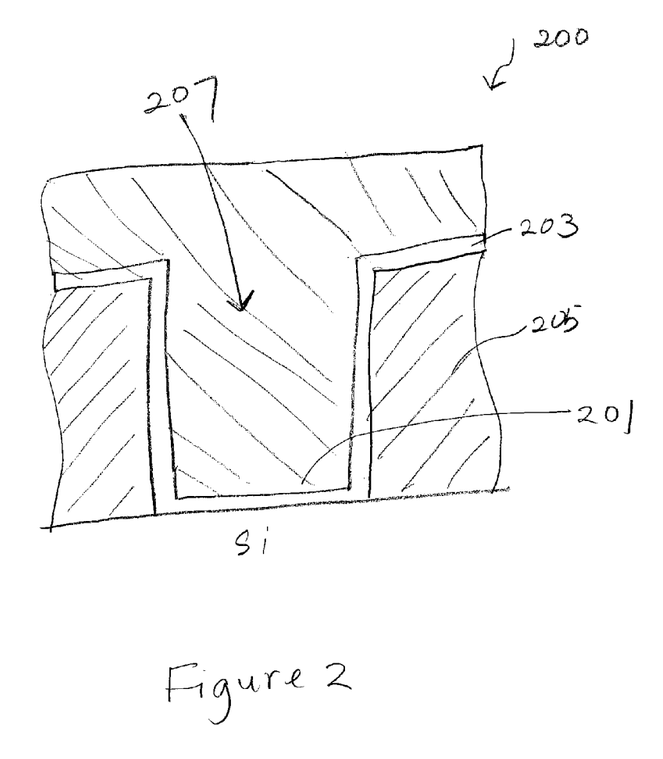
FIG. 2 is a simplified diagram of an ideal conventional metal contact structure.

FIG. 2 is a simplified diagram of an ideal conventional metal contact structure. This diagram is merely an example, which should not unduly limit the scope of the claims. One of ordinary skill in the art would recognize many variations, alternatives, and modifications.

As illustrated in FIG. 2, a contact structure 200 includes dielectric structures and/or layer 205. As an example, the dielectric structures are formed on a semiconductor substrate. The contact structure 200 includes an opening 207. A layer 203 of metal deposition (e.g., titanium and/or titanium nitride) is formed on the opening. Tungsten material is filled into the opening to form a contact portion 201. The contact portion 201 and the dielectrics are separated by the layer 203. In an ideal scenario, the tungsten material forms a perfect contact with the layer 203 as there are no impurities between the tungsten material and the layer 203.

The contact structure 200 as illustrated in FIG. 2 has been widely used for many applications, and such structure provides various performance advantages. Among others, the tungsten material that is used to form the contact region 201 typically provides low resistance value and good step coverage. The layer 203 is provided to make better bonding possible between the tungsten material and the silicon-based substrate. In certain applications, the layer 203 may be used as etch back stop layer, anti-reflection layer, etc.

Unfortunately, the ideal tungsten contact as described above is difficult to obtain in real life. Among other things, impurities are often formed on and/or within the layer 203, which typically leads to poor contact formations.

Figure 3:
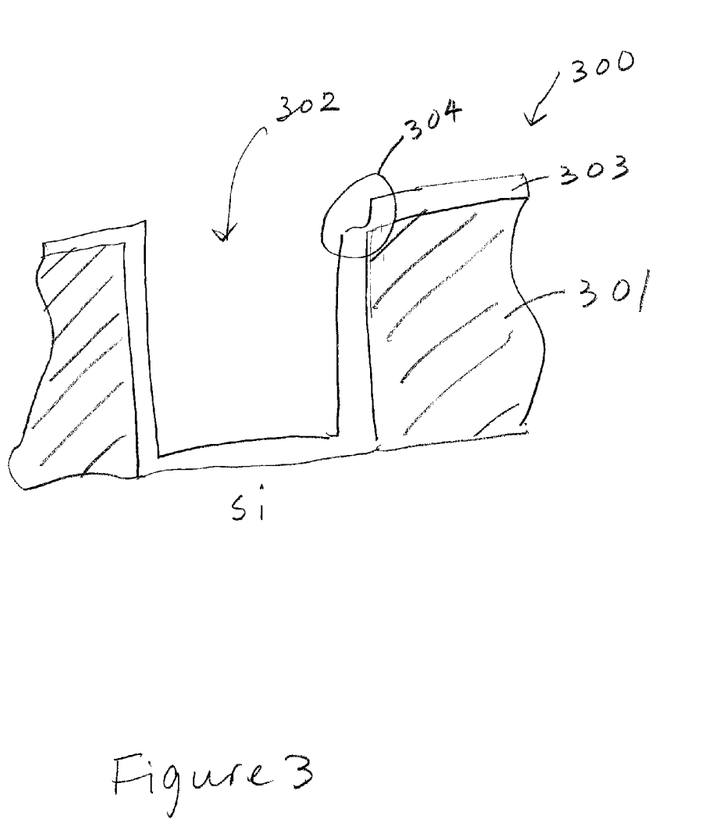
FIG. 3 is a simplified diagram illustrating a conventional dielectric structure for forming metal contacts.

FIG. 3 is a simplified diagram illustrating a conventional dielectric structure for forming metal contacts. This diagram is merely an example, which should not unduly limit the scope of the claims. One of ordinary skill in the art would recognize many variations, alternatives, and modifications.

In FIG. 3, a contact structure 300 is formed on semiconductor substrate materials. The contact structure 300 includes dielectric structures 301, which provide an opening 302. The opening 302 is covered by a layer 303. As an example, the layer 303 includes titanium and/or titanium nitride material that are deposited in the opening area of the contact structure 300. The layer 303 is annealed at a set of conditions according to conventional techniques. For example, the oxygen concentration is approximately thirty to forty parts per million and the annealing temperature is approximately 500 degrees Celsius.

As can be seen in FIG. 3, the contact structure 300 is different from the ideal structure 100 illustrated in FIG. 1. The contact structure 300 includes impurities and/or bad spots. For example, the contact structure 300 includes a spot 304 on the layer 303. During the formation of a metal contact, the spot 304 could lead to poor contact formation and high contact resistance.

Figure 4:
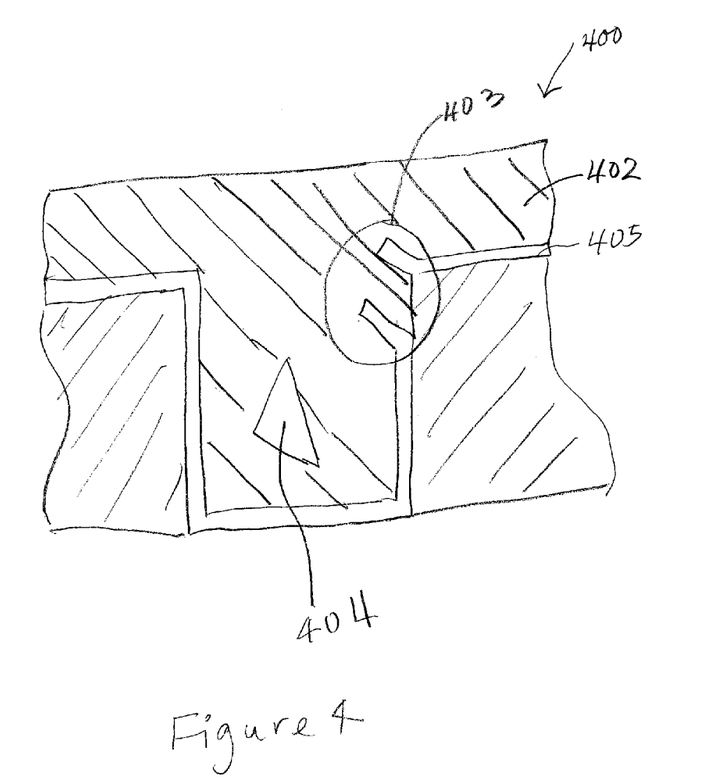
FIG. 4 is a simplified diagram of a conventional metal contact structure.

FIG. 4 is a simplified diagram of a conventional metal contact structure. As can be seen from FIG. 4, a contact structure 400 includes a tungsten contact portion 402, which is bonded to the layer 405. Within the contact portion 402, there are various spots and holes. For example, the spot 403 and the hole 404 are undesirable and hinders the performance of the contact structure 400. Among other things, these spots and holes often leads to poor contact bonding and undesired high resistance. Often the undesirable spots and holes are caused by poor annealing process performed for the layer 405.

Therefore, it is to be appreciated that various embodiments of the present invention produces contact structures with much better performance characteristics as compared to conventional contact structures.

Figure 5:
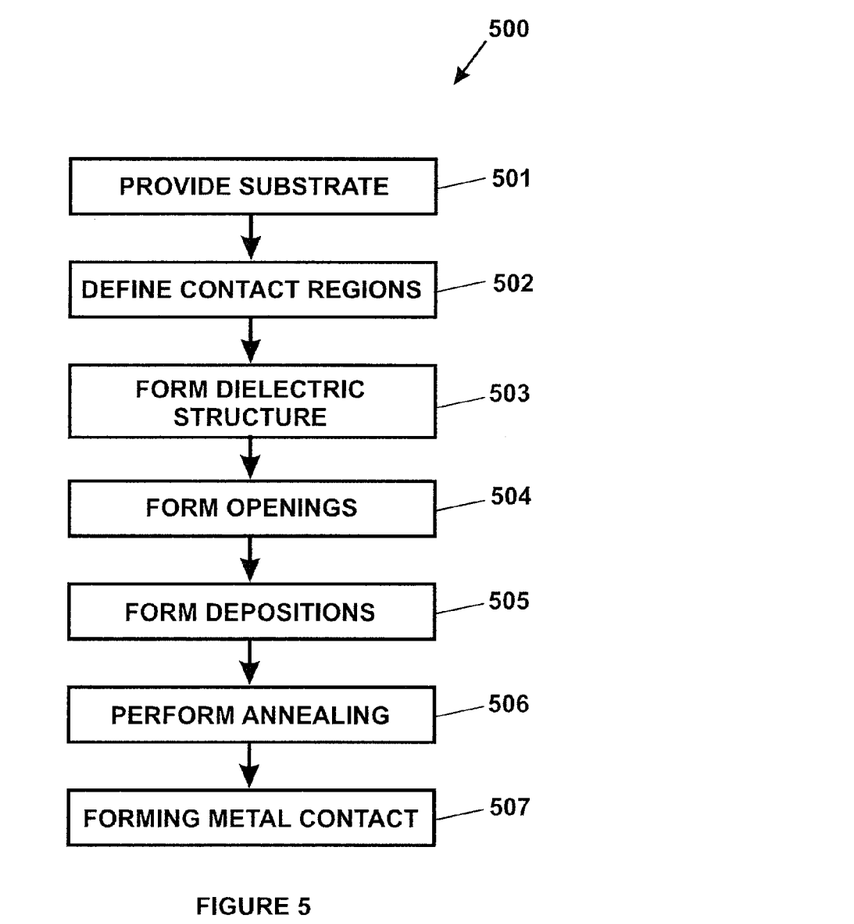
FIG. 5 is a simplified flow diagram illustrating a method for forming contact structures according to an embodiment of the present invention.

FIG. 5 is a simplified flow diagram illustrating a method for forming contact structures according to an embodiment of the present invention. This diagram is merely an example, which should not unduly limit the scope of the claims. One of ordinary skill in the art would recognize many variations, alternatives, and modifications. For example, various steps may be added, removed, repeated, replaced, rearranged, overlapped, and/or partially overlapped.

At step 501, a semiconductor substrate is provided. Typically, the semiconductor substrate includes a substantially pure silicon material.

At step 502, a plurality of contact regions on the semiconductor substrate are defined. For example, contact regions are defined according to specific reticle patterns for specific applications.

At step 503, a plurality of dielectric structures are formed on the plurality of contact regions. As an example, the dielectric structures are formed according to specific designs. In certain embodiments, the dielectric structures comprise layers of dielectric structures stacked.

At step 504, a plurality of openings is formed on the semiconductor substrate. According to a specific embodiment, each of the openings is characterized by at least a depth, a width, and an aspect ratio. Opening may be formed in various ways. For example, openings are formed by etching processes. Depending upon specific applications, openings may be deep trenches characterized by an aspect ratio of 1:10 or greater.

At step 505, deposition is formed within the openings using a first type of material. In a specific embodiment, the first type of material includes a titanium material and/or titanium nitride material. Depending upon application, other materials may be deposited within the opening. For example. titanium salicide deposition may be formed within the openings. In an embodiment, a layer of titanium is deposited first, and then a layer of titanium nitride is formed on top of the titanium layer. For example, the titanium layer and the titanium nitride layer are both approximately 250 to 300 angstrom in thickness.

At step 506, annealing is performed according to a predetermined set of conditions. According to certain embodiments, the predetermined set of conditions includes a predetermined range of temperatures and a predetermined range of oxygen concentrations. The predetermined range of oxygen concentrations is approximately between 141 parts per million to 1,000 parts per million. In certain specific embodiment, the oxygen concentration is approximately 150 parts per million. According to various embodiments, the temperature is approximately at 550 degrees Celsius. Depending upon application, temperature may range from 500 to 600 degrees Celsius. Usually, annealing process is performed for a duration of thirty minutes. Depending on application, the amount of time for performing annealing is adjusted accordingly. There are other conditions as well.

At step 507, metals contacts are formed by filling a metal material into the plurality of openings. According to embodiments, the metal material is tungsten and is characterized by low resistance value. Accordingly, low resistance value allows for high performance. It is to be appreciated that better performance and low resistance is possible largely due the methods according to the present invention. The advantages of the present invention are demonstrated below.

Figure 6:
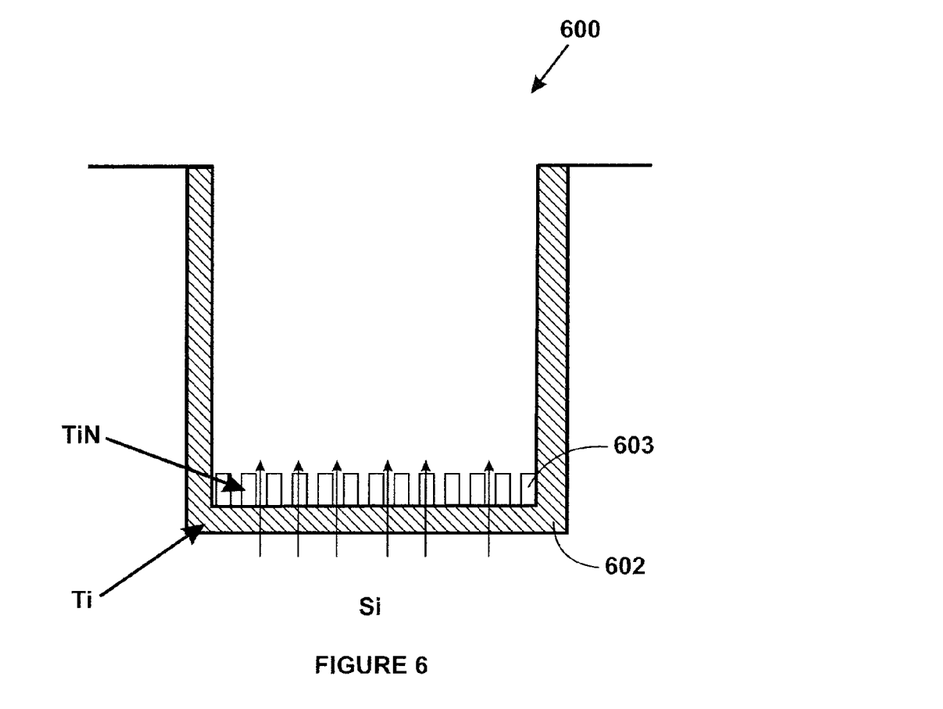
FIG. 6 is a simplified diagram illustrating a contact opening structure formed using conventional techniques.

FIG. 6 is a simplified diagram illustrating a contact opening structure formed using conventional techniques. This diagram is merely an example, which should not unduly limit the scope of the claims. One of ordinary skill in the art would recognize many variations, alternatives, and modifications.

As can be seen in FIG. 6, a contact structure 600 includes a titanium layer 602 and a titanium nitride layer 603. The titanium layer 602 is positioned on top of silicon material. The titanium nitride layer 603 typically cannot prevent silicon material from diffusing into the layer 603 during long thermal treatment. As a result, spots and/or holes are formed when the opening is filled with tungsten for contact formation.

Figure 7:
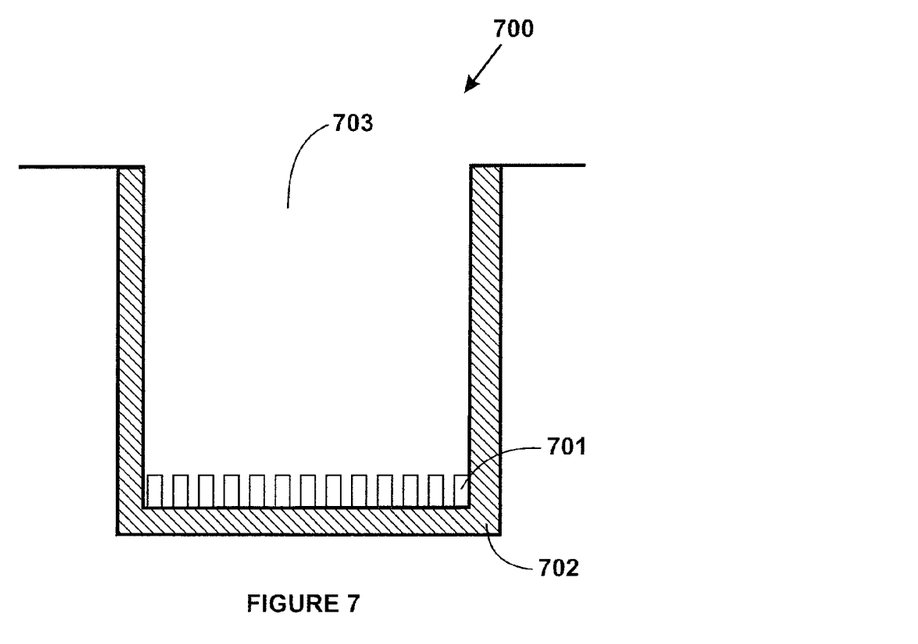
FIG. 7 is a simplified diagram illustrating a contact opening structure formed according to an embodiment of the present invention.

In comparison, embodiments of the present invention allow better contact to be formed by, among other things, reduce and/or eliminate silicon diffusion. FIG. 7 is a simplified diagram illustrating a contact opening structure formed according to an embodiment of the present invention. This diagram is merely an example, which should not unduly limit the scope of the claims. One of ordinary skill in the art would recognize many variations, alternatives, and modifications.

A contact structure 700 formed according to a specific embodiment of the present invention includes a titanium layer 702 to cover silicon and/or dielectric structure overlying an opening 703. The structure 700 additionally includes a titanium nitride layer 701 overlaying the titanium layer 702. During the thermal annealing process, both the layers 702 and 701 is in contact with oxygen 704 at approximately 150 parts per million, as compared to thirty to forty parts million according to conventional techniques. As a result, oxidation is formed at the titanium nitride layer 701. For example, the oxidation at the layer 701 prevents silicon from diffusing through the layer 701. When tungsten, or other metal material, is filled into the opening 703, high performance and low resistance contact is achieved.

Figure 8:
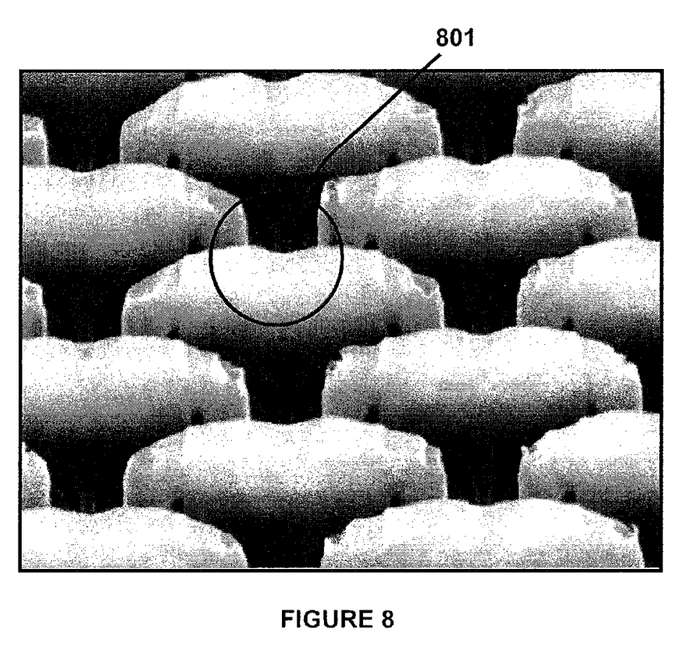
FIG. 8 is a diagram illustrating a cross sectional scan of a contact structure according to an embodiment of the present invention.

FIG. 8 is a diagram illustrating a cross sectional scan of a contact structure according to an embodiment of the present invention. This diagram is merely an example, which should not unduly limit the scope of the claims. One of ordinary skill in the art would recognize many variations, alternatives, and modifications. As an example, the cross sectional scan is obtained using scanning electronic microscope on a contact structure formed according to an embodiment of the present invention. As shown in the scan, a tungsten contact 801 has well defined shape and does not include much trouble spots.

Figure 9:
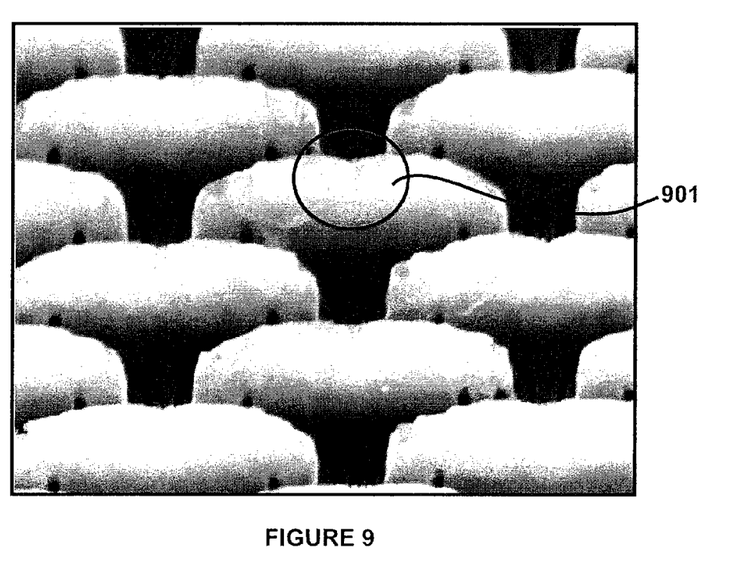
FIG. 9 is a diagram illustrating a cross sectional scan of a contact structure formed using conventional techniques.

In comparison, contacts formed using conventional techniques are often characterized by trouble spots. FIG. 9 is a diagram illustrating a cross sectional scan of a contact structure formed using conventional techniques. As can be seen in the scan, the contact 901 formed by conventional techniques include trouble spots (e.g., white spots in the scan), which hinders performance of contacts.

According to an embodiment, the present invention provides a method for manufacturing integrated circuits. The method includes a step for providing a semiconductor substrate. The method also includes a step for defining a plurality of contact regions on the semiconductor substrate. The method further includes a step for forming a plurality of dielectric structures on the plurality of contact regions. Additionally, the method includes a step for forming a plurality of openings on the semiconductor substrate. For example, each of the openings is characterized by at least a depth, a width, and an aspect ratio. Furthermore, the method includes a step for performing deposition within the openings using a first type of material, which includes a titanium material. The method additionally includes a step for performing annealing at a predetermined set of conditions, which includes a predetermined range of temperatures and a predetermined range of oxygen concentrations. For example, the predetermined range of oxygen concentrations is approximately between 141 parts per million to 1,000 parts per million. Also, the method includes a step for forming metals contacts by filling a tungsten material into the plurality of openings. For example, the metal contacts is associated with a low resistance value. For example, the method can be illustrated according to FIG. 5.

According to another embodiment, the present invention provides a method for manufacturing integrated circuits. The method includes a step for providing a semiconductor substrate. The method also includes a step for defining a plurality of contact regions on the semiconductor substrate. Additionally, the method includes a step for forming a plurality of dielectric structures on the plurality of contact regions. The method further includes a step for forming a plurality of openings on the semiconductor substrate. Each of the openings is characterized by at least a depth, a width, and an aspect ratio. Also, the method includes a step for performing deposition within the openings using a first type of material (e.g. a titanium material). The method further includes a step for forming a thickness of oxidation layer on the first type of material. Moreover, the method includes a step for forming metals contacts by filling a tungsten material into the plurality of openings. Among other things, the metal contacts is associated with a low resistance value. For example, the method can be illustrated according to FIG. 5.

According to yet another embodiment, the present invention provides a method for manufacturing integrated circuits. The method includes a step for providing a partially processed semiconductor substrate. The partially processed semiconductor substrate includes at least one opening positioned within a dielectric structure. The method also includes a step for forming a deposition layer within the at least one opening using a first type of material, which includes a titanium material. The method additionally includes a step for performing annealing at a predetermined set of conditions, which includes a predetermined range of temperatures and a predetermined range of oxygen concentrations. For example, the predetermined range of oxygen concentrations is approximately between 141 parts per million to 1,000 parts per million. Furthermore, the method includes a step for forming metals contacts by filling a tungsten material into the plurality of openings. For example, the metal contacts are associated with a low resistance value. For example, the method can be illustrated according to FIG. 5.

Many benefits are achieved by way of the present invention over conventional techniques. For example, the present technique provides an easy to use process that relies upon conventional technology. In some embodiments, the present invention provides an improved method for forming contacts with high performance and low resistance. Additionally, the method provides a process that is compatible with conventional process technology without substantial modifications to conventional equipment and processes. Depending upon the embodiment, one or more of these benefits may be achieved. These and other benefits will be described in more throughout the present specification and more particularly below.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for manufacturing integrated circuits comprising:
   providing a semiconductor substrate;
   defining a plurality of contact regions on the semiconductor substrate;
   forming at least one dielectric structure on the plurality of contact regions;
   forming a plurality of openings on the semiconductor substrate, each of the openings being characterized by at least a depth, a width, and an aspect ratio;
   performing deposition within the openings using a titanium material;
   forming, within the openings, an insulating material on the titanium material;
   annealing the titanium material using a temperature range of 500 to 600 degrees Celsius and an oxygen concentration range of 141 to 1,000 parts per million, the annealing causing oxidation of the top surface of the titanium material to form a barrier configured to prevent silicon from diffusing through the titanium material; and
   forming metal contacts by filling a tungsten material into the plurality of openings, the metal contacts being associated with a low resistance value.

2. The method of claim 1 further comprising forming a deposition layer using the titanium material.

3. The method of claim 2 wherein the deposition layer includes an etch back layer.

4. The method of claim 2 wherein the deposition layer includes an anti-reflection layer.

5. The method of claim 1 wherein annealing is performed for approximately thirty minutes.

6. The method of claim 1 wherein the integrated circuits comprise a DRAM cell.

7. The method of claim 1 wherein the insulating material comprises titanium nitride.

8. The method of claim 1 wherein the insulating material comprises titanium silicide.

9. The method of claim 1 wherein the performing deposition comprises forming an etch back layer.

10. The method of claim 1 wherein the performing deposition comprises forming an anti-reflection layer.

11. The method of claim 1 wherein the performing deposition comprises forming a glue layer.

12. The method of claim 1 wherein the metal contacts comprise a tungsten plug.

13. The method of claim 1 wherein the insulating material comprises a titanium nitride layer overlying the titanium material.

14. The method of claim 13 wherein the titanium material and the titanium nitride layer each have a thickness of about 250 Angstroms to about 300 Angstroms.

15. The method of claim 13 wherein the annealing causes oxidation of the titanium nitride layer configured to prevent diffusion of silicon into the tungsten material.

16. The method of claim 1 wherein the aspect ratio is characterized by a width-to-depth ratio of 1:10 or greater.

17. A method for manufacturing integrated circuits comprising:
   providing a semiconductor substrate;
   defining a plurality of contact regions on the semiconductor substrate;
   forming at least one dielectric structure on the plurality of contact regions;
   forming a plurality of openings on the semiconductor substrate, each of the openings being characterized by at least a depth, a width, and an aspect ratio;
   performing deposition within the openings using a titanium material comprising a titanium layer and comprising a titanium nitride layer overlying the titanium layer;
   annealing the titanium nitride layer to cause oxidization of the titanium nitride layer to form a barrier configured to prevent silicon from diffusing through the titanium nitride layer; and
   forming metal contacts by filling a tungsten material into the plurality of openings, the metal contacts being associated with a low resistance value.

18. A method for manufacturing integrated circuits comprising:
   providing a partially processed semiconductor substrate, the partially processed semiconductor substrate including at least one opening positioned within a dielectric structure;
   forming a deposition layer within the at least one opening using a first type of material, the first type of material including a titanium material and including an insulating material;
   annealing the titanium material using a temperature range of 500 to 600 degrees Celsius and an oxygen concentration range of 141 to 1,000 parts per million, the annealing causing oxidation of the top surface of the titanium material to form a barrier configured to prevent silicon from diffusing through the titanium material; and
   forming metal contacts by filling a tungsten material into the plurality of openings, the metal contacts being associated with a low resistance value.

19. The method of claim 18 wherein the insulating material comprises titanium nitride.

20. The method of claim 18 wherein the deposition layer forms an ohmic contact with the dielectric structure.

\* \* \* \* \*